(12) United States Patent
Muller et al.

(10) Patent No.: US 6,537,418 B1
(45) Date of Patent: *Mar. 25, 2003

(54) SPATIALLY UNIFORM GAS SUPPLY AND PUMP CONFIGURATION FOR LARGE WAFER DIAMETERS

(75) Inventors: K. Paul Muller, Wappingers Falls, NY (US); Bertrand Flietner, Hopewell Junction, NY (US); Klaus Roithner, Dresden (DE)

(73) Assignee: Siemens Aktiengesellschaft, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/934,101

(22) Filed: Sep. 19, 1997

(51) Int. Cl.[7] .......................................... H01L 21/3065
(52) U.S. Cl. .............. 156/345.34; 118/715; 118/723 E; 156/345.51
(58) Field of Search .......................... 156/345; 118/715; 392/416; 216/67; 422/186.06; 438/710; 66/76

(56) References Cited

U.S. PATENT DOCUMENTS

| | | | |
|---|---|---|---|
| 4,209,357 A | | 6/1980 | Gorin et al. ............ 156/345.34 |
| 4,579,618 A | * | 4/1986 | Celestino et al. ............ 156/345 |
| 4,590,042 A | * | 5/1986 | Drage .................... 422/186.06 |
| 5,422,139 A | | 6/1995 | Fischer ..................... 427/248.1 |
| 5,624,498 A | * | 4/1997 | Lee et al. ..................... 118/715 |
| 5,716,534 A | * | 2/1998 | Tsuchiya et al. ............... 216/67 |
| 5,744,049 A | * | 4/1998 | Hills et al. ...................... 216/67 |
| 5,781,693 A | * | 7/1998 | Ballance et al. ............. 392/416 |

* cited by examiner

Primary Examiner—Jeffrie R. Lund
Assistant Examiner—Rudy Zervigon

(57) ABSTRACT

A gas distribution plate (60) for a semiconductor processing chamber (86) includes a gas distribution plate for distributing gases across a surface of a semiconductor wafer (84) to be processed in the chamber. The gas distribution plates has a substantially planar member having gas outlets for distributing a reactant gas across the surface of the semiconductor wafer, the gas outlet means includes a plurality of apertures (66) defined in said planar member, the plurality of apertures having different areas at predetermined locations to adjust etching gas flow. A pump (80) is provided for evacuating a reactant-product gas created across the surface of the semiconductor wafer during wafer processing. The pump (80) includes a plurality of tubes extending through the planar member, the plurality of tubes having apertures, and the apertures have different areas at predetermined locations to adjust reactant gas and reactant-product gas flow wherein the gas outlets and the pump coact to substantially maintain a predetermined concentration of the reactant gas and a predetermined concentration of the reactant-product gas across the surface of the semiconductor wafer during wafer processing.

2 Claims, 9 Drawing Sheets

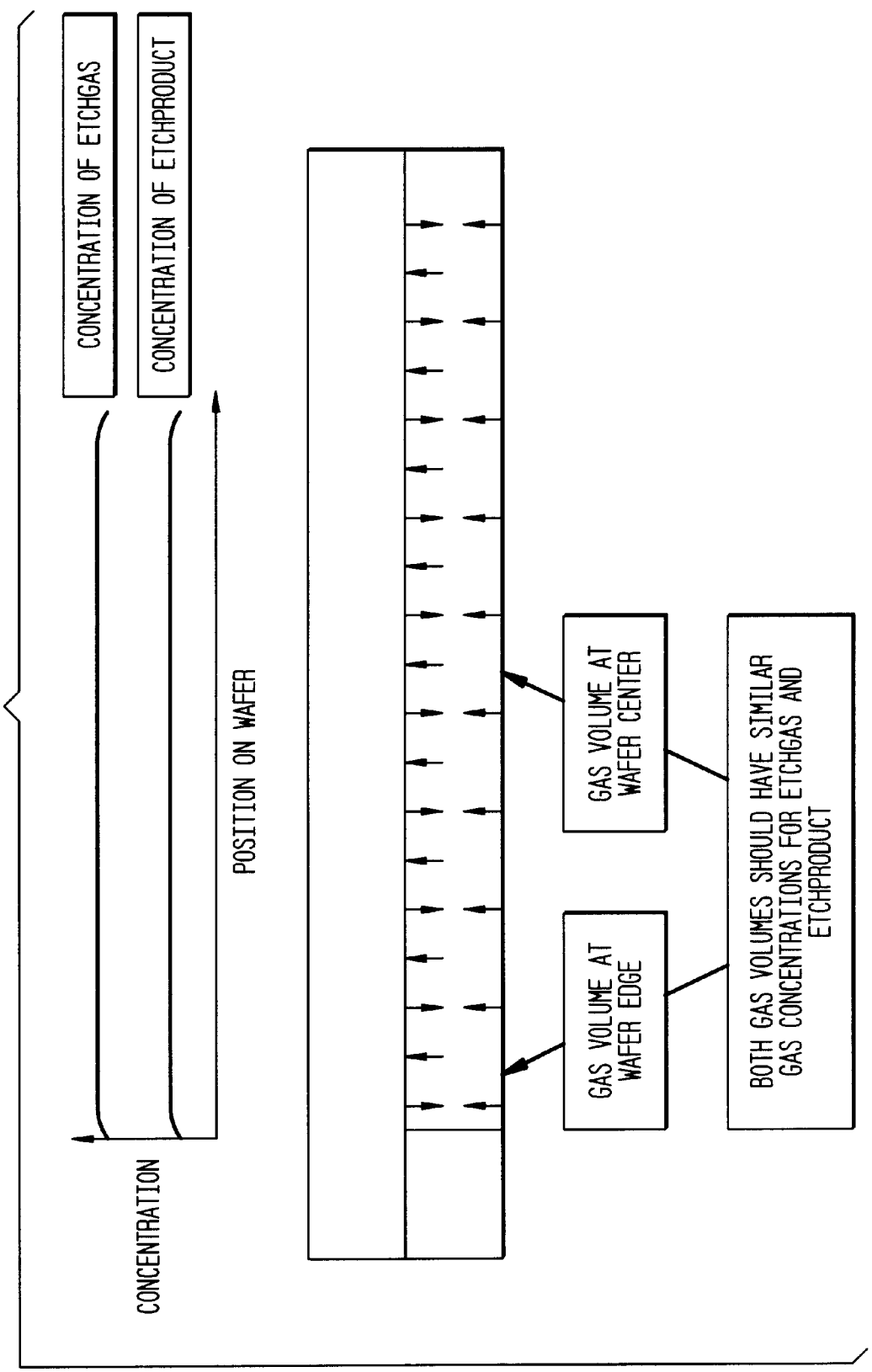

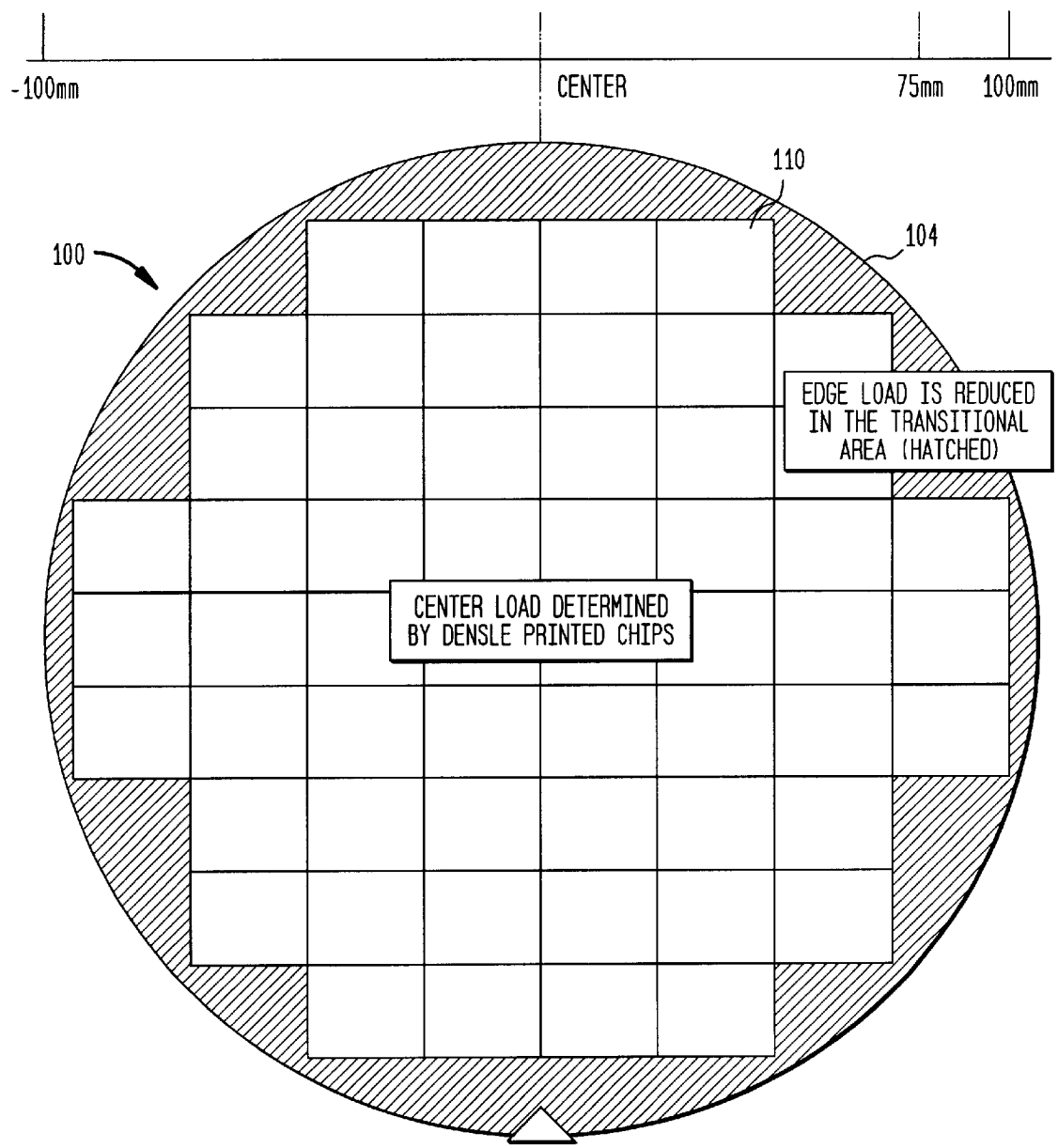

SPATIALLY UNIFORM GAS SUPPLY AND PUMP CONFIGURATION FOR LARGE WAFER DIAMETERS

FIELD OF THE INVENTION

The invention relates generally to semiconductor wafer etching and more specifically to an improved gas distribution plate which substantially reduces the nonuniformities in the etch process that occurs across the semiconductor wafer.

BACKGROUND OF THE INVENTION

As is well known in the art, various semiconductor fabrication techniques require the selective removal of deposited metal and dielectric films and in the case of DRAM processing, the etching of deep trenches in the semiconductor wafer. Of late, the trend has been away from well known wet chemical etching processes and toward dry etching processes such as reactive ion etching and plasma etching. This is due in large part to the improved controllability and cost effectiveness imparted by the dry etching processes when compared with wet chemical etching processes.

Both reactive ion etching and plasma etching take place in a process chamber which is designed to process a single semiconductor wafer at a time. The semiconductor wafer is mounted on a wafer chuck which forms the bottom electrode of the process chamber. An upper electrode is located over the semiconductor wafer. The semiconductor wafer is bombarded by ions generated between the upper electrode spaced above the substrate and a lower electrode forming the substrate stage of the process chamber. An etchgas, which not only provides the source for the ions, but also improves the etch rate reactively, is transported to and distributed across the substrate via a gas distribution plate under a partial vacuum or a high vacuum. These operational pressures are dependent upon whether the process is reactive ion etching or plasma etching.

In single wafer systems, pressure differences and differences in the etchgas/etch product mixture can lead to etching nonuniformities across the surface of the substrate, especially from the center of the substrate to the edge of the substrate. The nonuniformities become more severe as the diameter of the substrate increases, particularly when the substrate approaches or exceeds 300 mm in diameter. Such nonuniformities of film deposition or etching can lead to various problems. For example, in the manufacture of semiconductors and integrated circuits, such nonuniformities can result in devices that do not function or function with less than optimal results.

The prior art has provided various solutions to the problem of nonuniform etching of the substrate. One such solution is to utilize different gas distribution plates for different diameter substrates or focus rings to compensate for the nonuniformities of the etching process. A disadvantage to this approach is that finding the correct gas distribution plate or focus ring can be very time consuming and thus costly. In addition, the appropriate gas distribution plate for a particular etching process may not be appropriate for another etching process. Consequently, in order to use the same apparatus for a different process, the user must change the gas distribution plate which results in expensive down time.

Accordingly, a need exists for an improved gas distribution plate that substantially reduces etching nonuniformities which occur between the center and edge of the semiconductor wafer using prior art gas distribution plates.

SUMMARY OF THE INVENTION

A gas distribution plate for a semiconductor processing chamber includes a gas distribution plate for distributing gases across a surface of a semiconductor wafer to be processed in the chamber. The gas distribution plates has a substantially planar member having gas outlet means for distributing a reactant gas across the surface of the semiconductor wafer, the gas outlet means includes a plurality of apertures defined in said planar member, the plurality of apertures having different areas at predetermined locations to adjust etching gas flow. A pumping means is provided for evacuating a reactant-product gas created across the surface of the semiconductor wafer during wafer processing. The pumping means includes a plurality of tubes extending through the planar member, the plurality of tubes having apertures, and the apertures have different areas at predetermined locations to adjust reactant gas and reactant-product gas flow wherein the gas outlet means and the pumping means coact to substantially maintain a predetermined concentration of the reactant gas and a predetermined concentration of the reactant-product gas across the surface of the semiconductor wafer during wafer processing.

BRIEF DESCRIPTION OF THE DRAWINGS

For a detailed understanding of the present invention, reference should be made to the following detailed description taken in conjunction with the accompanying drawings wherein:

FIG. 3D graphically illustrates how the concentration of both the etch gas and the etchproduct remains substantially the same across the entire wafer from edge to edge using the gas distribution plate of the invention;

FIG. 4A depicts 256 Mb DRAM chips arranged on a 200 mm wafer;

DETAILED DESCRIPTION OF THE INVENTION

The gas distribution plate of the invention addresses several of the factors which cause nonuniform etching between the center and the edge of the wafer. One of these factors relates to the operational pressure difference which occurs between the center and the edge of the process chamber. Another factor which causes nonuniform etching has to do with the velocity of the etchgas being pumped into the process chamber.

Figure 1A:
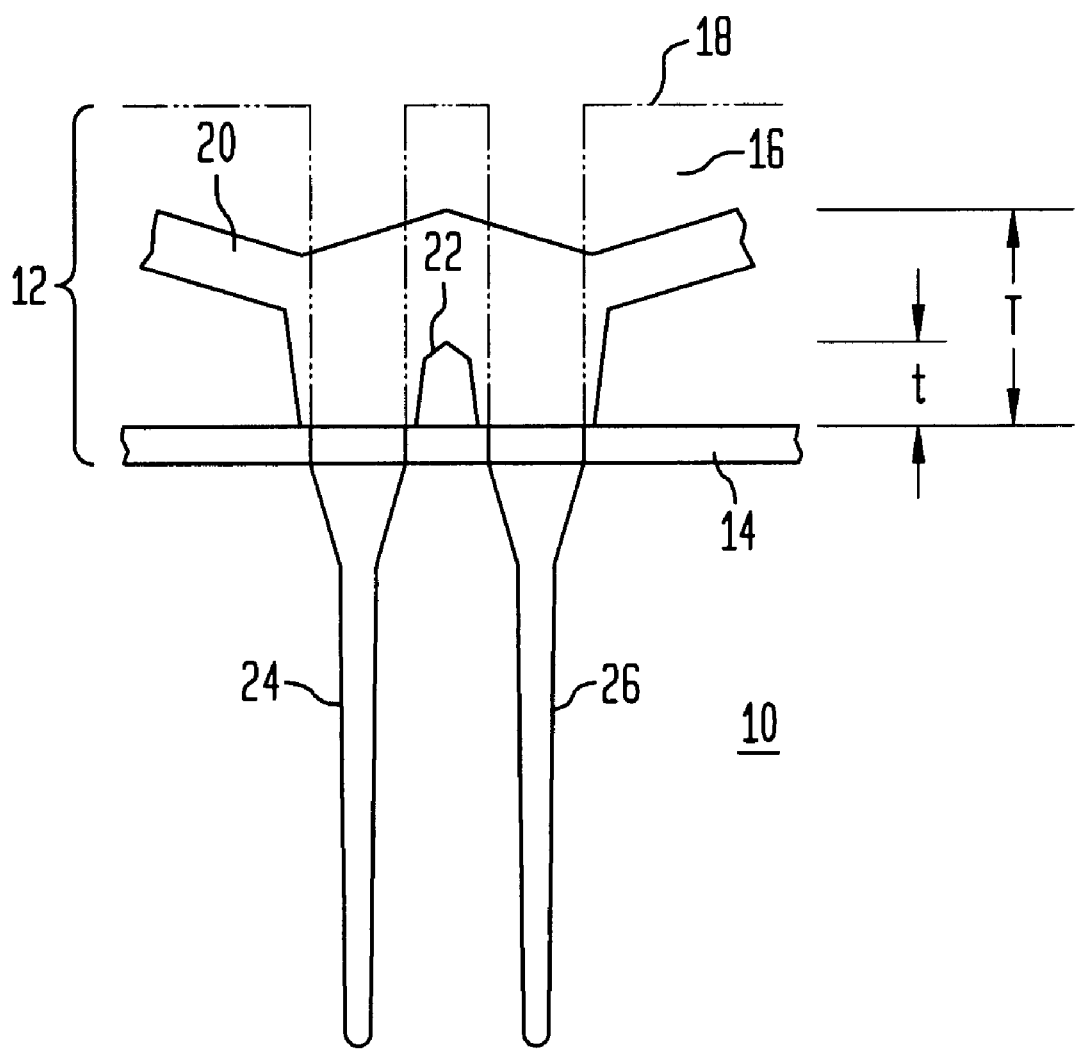
FIG. 1A is a cross-sectional side view through a semiconductor wafer after deep trench etching using a prior art gas distribution plate.

Referring to FIG. 1A, there is shown a segment of a 200 mm semiconductor wafer 10 which has a typical etch configuration for a high etchrate deep trench etch. The wafer 10 was etched in a TEL84 DRM process chamber 28 (FIG. 1B) with a 27 mm gap set between the upper electrode of the process chamber and the wafer 10. The wafer 10 is comprised of bulk silicon covered by a deep trench etch hard mask 12 which includes a pad nitride layer 14 and a pad TEOS layer 16. The broken lines denoted by numeral 18, depict the pad TEOS layer 16 after patterning and before deep trench etching. The solid lines depict how the pad TEOS layer 16 is eroded during deep trench etching. More specifically, a solid line 20 depicts the maximum thickness T of the pad TEOS layer 16 after etching and a solid line 22 depicts the vertical portion of the remaining hard mask which is the thickness t of the portion of the pad TEOS layer 16 remaining on the wafer 10 between the openings to the deep trenches 24 and 26.

Figure 1B:
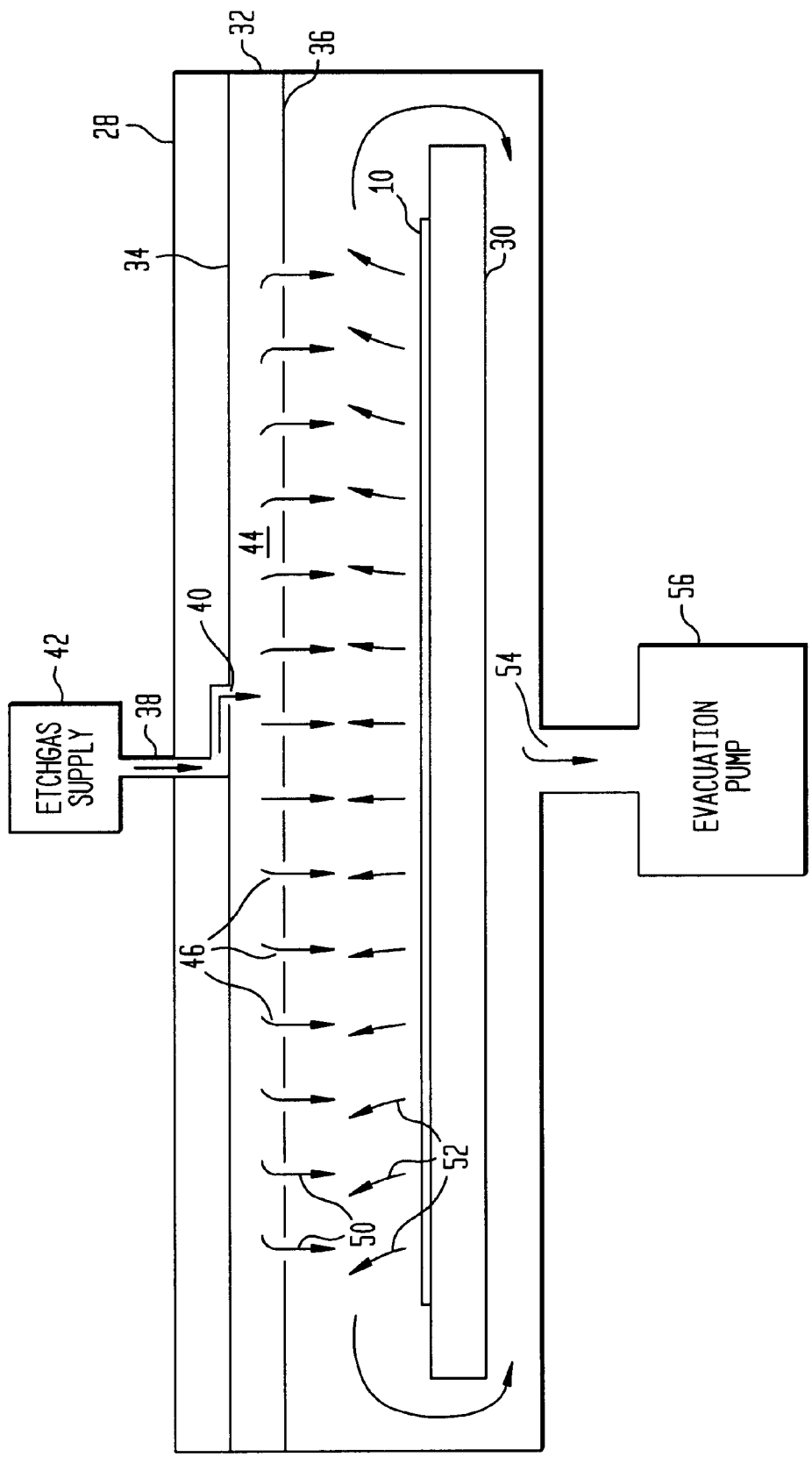
FIG. 1B is a schematic illustration of a prior art gas distribution plate mounted in a wafer processing chamber.

FIG. 1B depicts the TEL84 DRM process chamber 28 including a prior art anode gas distribution plate 32 (GDP) which produced the etch configuration of FIG. 1A. The process chamber 28 employs a cathode wafer chuck 30 for supporting the wafer 10 during etching. The GDP 32 includes an upper plate 34 and a lower plate 36. A gas inlet line 38 connects an etchgas supply 42 to a centrally located gas inlet aperture 40 on the upper plate 34 and introduces the etchgas into the space 44 between the upper and lower plates 34 and 36. A plurality of gas outlet apertures 46 are uniformly distributed across the lower plate 36 and extend out to the edge of the wafer 10. During deep trench etching, the etchgas (shown as arrows 50) is supplied from the etch supply 42 through the gas inlet line 38 to the space 44 between the upper and lower plates 34 and 36 via the gas inlet aperture 40. The etchgas flows out from the space 44 between the upper and lower plates 34 and 36 through the gas outlet apertures 46 and is uniformly distributed across the surface of the wafer 10. The etchgas 50 and etchproduct gases 52 are evacuated from the process chamber through an exhaust port 54 located under the wafer chuck 30 via an evacuation pump 56.

Figure 1C:
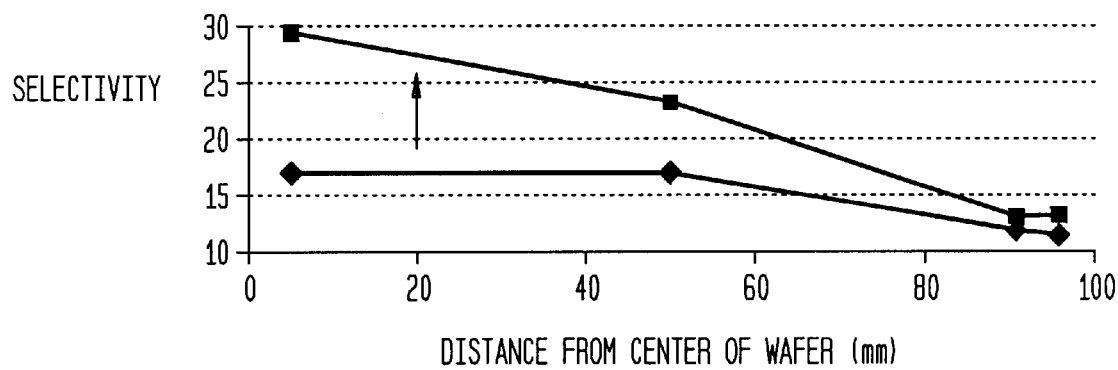
FIG. 1C depicts etching selectivity versus distance from the center of the wafer for deep trench etching performed both under standard processing pressures and under 40 percent higher processing pressures using the prior art gas distribution plate of FIG. 1B.
Figure 1D:
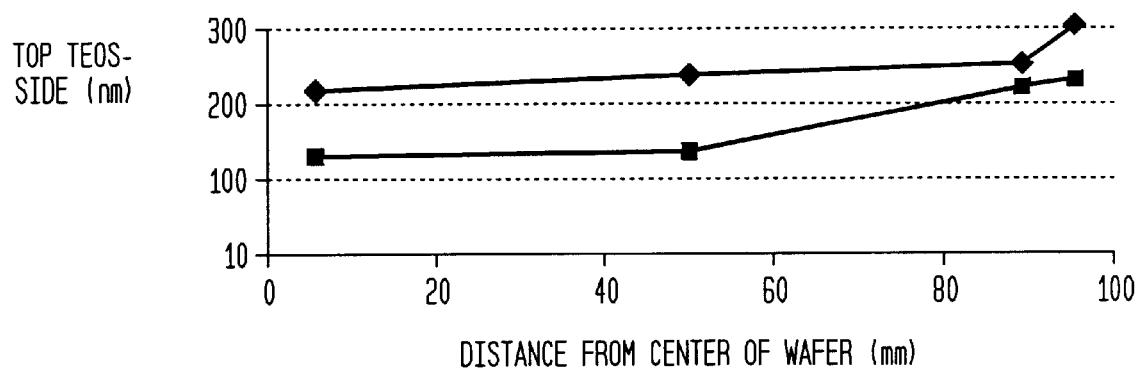
FIG. 1D depicts the thickness difference between the maximum remaining hard mask thickness an the vertical portion of the remaining hard mask versus distance from the center of the wafer for deep trench etching performed both under standard processing pressures and under 40 percent higher processing pressures using the prior art gas distribution plate of FIG. 1B.

The pad TEOS erosion rate which produced the configuration shown in FIG. 1A is graphically depicted in FIGS. 1C and 1D. FIG. 1C depicts etching selectivity versus distance from the center of the wafer for deep trench etching performed both under standard processing pressures and under 40 percent higher processing pressures. FIG. 1D depicts the thickness difference between the maximum TEOS thickness and the vertical portion of the remaining hard mask versus distance from the center of the wafer for deep trench etching performed both under standard processing pressures and under 40 percent higher processing pressures.

As shown in FIG. 1C for deep trench etching under standard processing pressures, the etching selectivity to the pad TEOS layer decreases as you move to the outer edge of the wafer. When a 40 percent higher etching processing pressure is used, the density of the etchgas increases and produces a desirable increase in the selectivity to the pad TEOS layer. The selectivity, however, only increases significantly at or near the center of the wafer. As shown in FIG. 1D, the selectivity drop occurring at the outer edge of the wafer using standard processing pressures, increases the thickness difference, between the maximum TEOS thickness and the height of side of house. The 40 percent increase in the processing pressure, however, undesirably increases this thickness difference as you move from the center to the outer edge of the wafer because the increased processing pressure has much greater impact on the etching selectivity at the center of the wafer than at the edge of the wafer. This information suggests that the gas flow dynamics of the system produces a major pressure increase only at the center of the wafer and not at the edge of the wafer. Such a result is believed to be caused by the pressure at the center of the process chamber being significantly different from the pressure at the edge of the process chamber where the edge of the wafer is oriented.

Figure 2A:
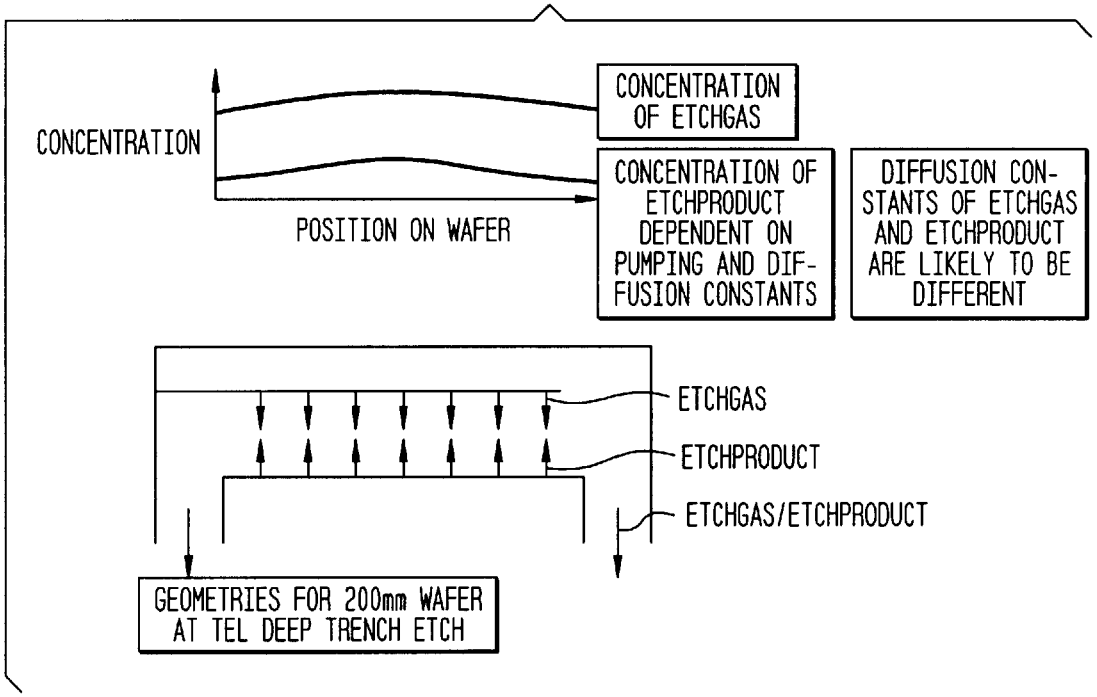
FIG. 2A shows how the concentration of both the etch gas and the etchproduct changes across the entire wafer from edge to edge for a 200 mm wafer using the prior art gas distribution plate of FIG. 1B.
Figure 2B:
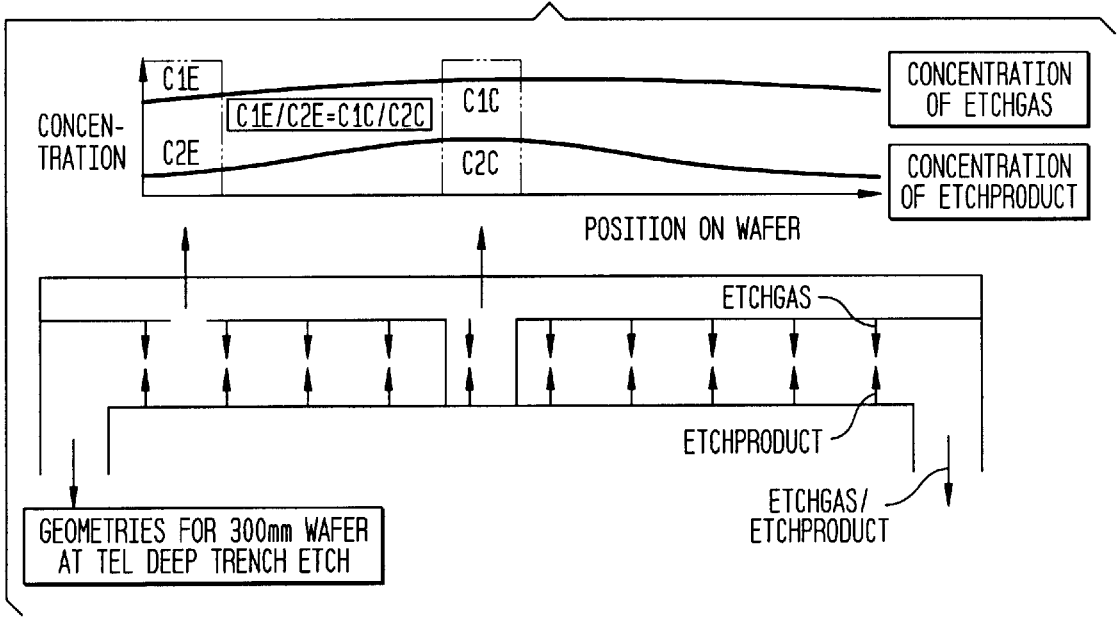
FIG. 2B depicts an etch configuration corresponding to a TEL84 DRM with a 20 mm gap between a 300 mm wafer and the upper electrode of the process chamber for etchrates of 1500 nm/min and higher using the prior art gas distribution plate of FIG. 1B.

An additional factor which can cause nonuniformity of the etching process involves the etchproduct produced during deep trench etching. During etching, the etchproduct as well as the etchgas must be transported away from the substrate via the evacuation pump of the process chamber. The existing evacuation method shown in FIG. 1B, produces the results shown in FIGS. 2A and 2B. As shown, the existing evacuation method allows pressure differences across the wafer and differing diffusion coefficients of the etchgas and etch product, which produces an etchgas and etchproduct distribution. FIG. 2A shows how the concentration of both the etch gas and the etchproduct changes across the entire wafer from edge to edge for a 200 mm wafer. For even larger wafer diameters and higher etchrates, the etchgas/etchproduct distribution gets worse. This is shown in FIG. 2B, which depicts an etch configuration corresponding to a TEL84 DRM with a 20 mm gap between a 300 mm wafer and the upper electrode of the process chamber for etchrates of 1500 nm/min and higher. As can be seen the etchgas and etchproduct concentrations C1C and C2C respectively at the center of the wafer are substantially different from the etchgas and etchproduct concentrations C1E and C2E at the edge of the wafer. Accordingly, comparing a gas volume in the center of the wafer to a gas volume at the edge of the wafer, one can expect a significant difference in the gas mixture and the pressure of the etchgas and etchproduct.

Figure 3A:
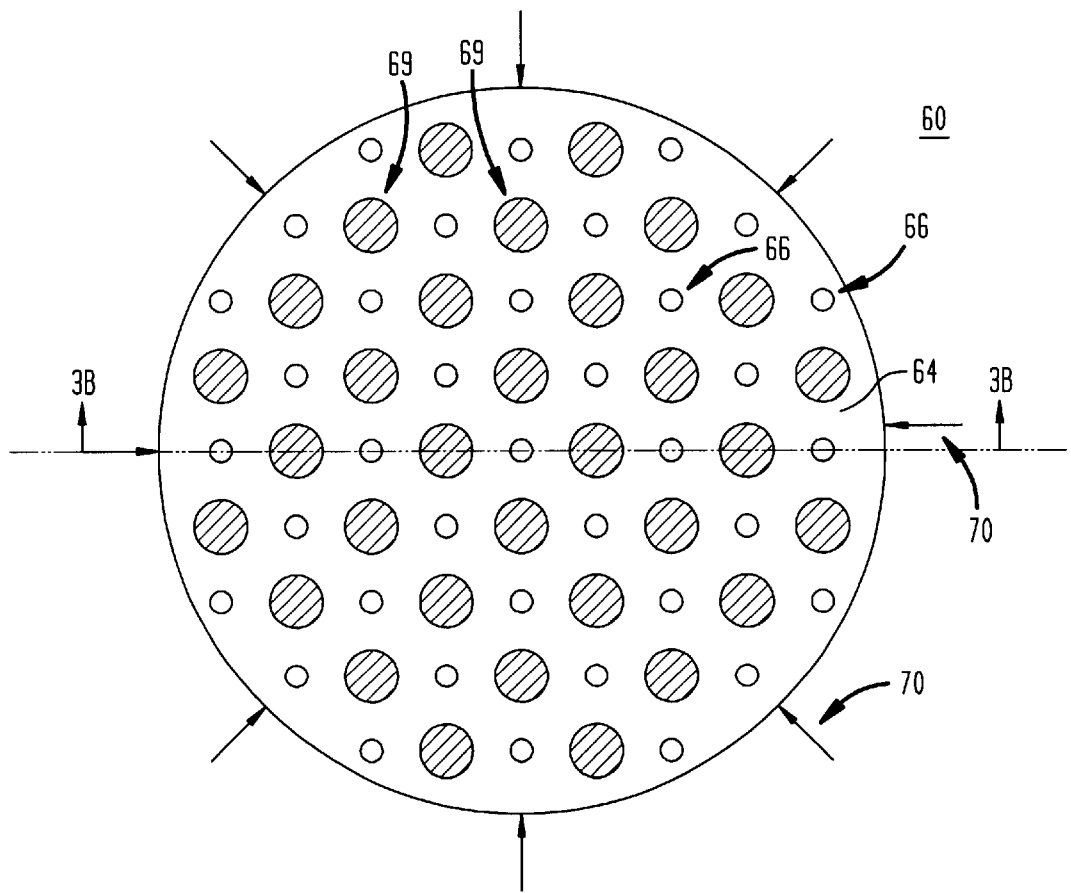
FIG. 3A depicts a bottom plan view of the gas distribution plate of the invention.
Figure 3B:
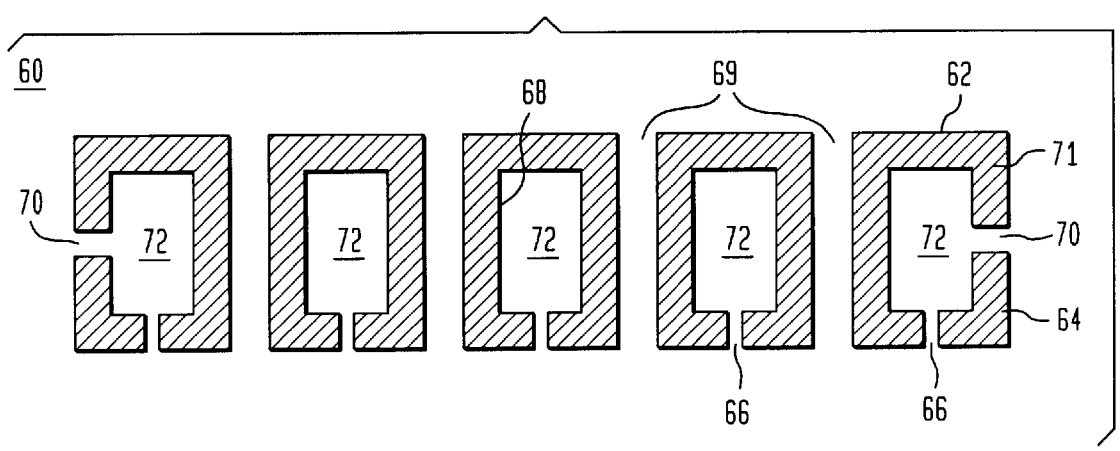
FIG. 3B is a cross-sectional side view through line 3B—3B of the gas distribution plate of FIG. 3A.

Referring to FIGS. 3A and 3B, there is shown a GDP 60 according to the invention. The GDP 60 comprises an upper plate 62 and a lower plate 64 which is spaced apart from the upper plate 62 to define a space or manifold 72. A plurality of spaced apart cylindrical tubes 68 extend between the upper plate 62 and the lower plate 64, through the space 72. Each tube 68 defines a gas through channel 69. A plurality of spaced apart gas inlet apertures 70 are defined in a circumferential surface 71 extending between the upper and lower plates 62 and 64, although the gas inlet apertures could also be formed in the upper plate 62 if desired. The lower plate 64 includes a plurality of spaced apart gas outlet apertures 66.

The GDP 60 of the invention enables wafers, especially large diameter wafers on the order of 300 mm and up, to be uniformly etched with minimal etchgas flow and pressure restrictions since the etchgas supply and etchgas/etchproduct evacuation are both performed by the GDP 60.

Figure 3C:
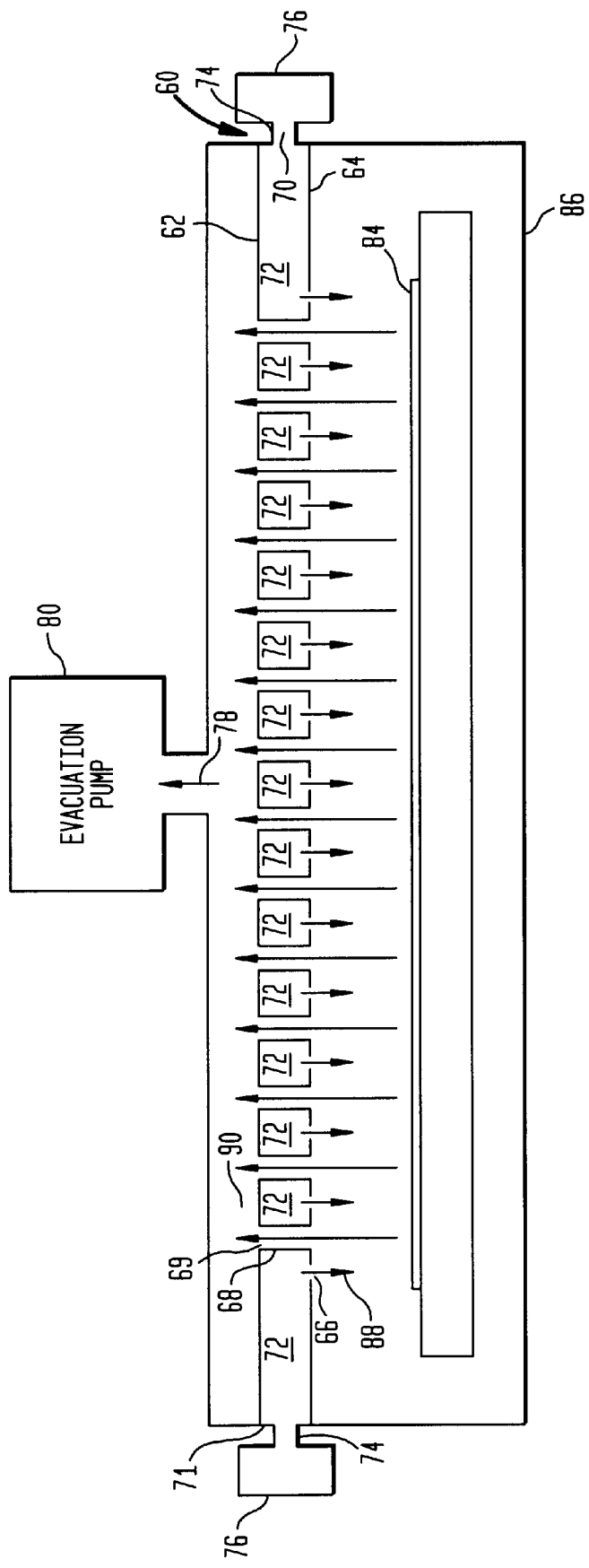
FIG. 3C schematically illustrates the gas distribution plate of the invention mounted in a wafer processing chamber.

FIG. 3C depicts the GDP 60 as it is installed in a process chamber 86 such as TEL84 DRM process chamber. An annular gas inlet line 76 extends around the GDP 60 and includes a plurality of branches 74 which connect an etchgas supply (not shown) to the gas inlet apertures 70 defined along the surface 71 to introduce an etchgas 88 into the space 72 between the upper and lower plates 62 and 64. The flow of etch 88 gas through the gas inlet line 76 is controlled by conventional valves. The plurality of gas outlet apertures 66 are uniformly distributed across the lower plate 64 and extend out to the edge of the wafer 84. During deep trench etching, the etchgas (shown as arrows 88) is supplied from the etch supply through the gas inlet line 76 and branches 74 to the space 72 between the upper and lower plates 62 and 64 via the gas inlet apertures 70. The etchgas 88 flows out from the space 72 through the gas outlet apertures 66 and is uniformly distributed across the surface of the wafer 84. The gas outlet apertures 66 are of a size which ensures a significant pressure drop between the lower plate 64 of the GDP 60 and the surface of the wafer 84 in order to provide a uniform pressure of gas in the GDP 60. The etchgas 88 and etchproduct gases 90 are evacuated from the process chamber through the gas through channels 69 defined by the tubes 68 of the GDP 60 and the evacuation port 78 located above the GDP 60 via an evacuation pump 80, which controls the etchgas pressure between the upper and lower plates 62 and 64 of the GDP 60. Accordingly, the GDP 60 of the invention produces small cells of local equilibrium in gas pressure across the surface of the wafer 84, i.e., the partial pressure of etchgas 88 and etchproduct 90 are substantially constant across the wafer. Thus, a gas volume at the edge of the wafer 84 will have similar gas concentrations of etchgas and etchproduct as a gas volume near the center of the wafer 84.

FIG. 3D graphically depicts the results of using the GDP of the invention to etch a 300 mm wafer. FIG. 3D plots the concentrations of etchgas and etchproduct in relation to the position on wafer. As can be seen, the concentration of etchgas is nearly independent of the position on the wafer. Likewise, concentration of etchproduct is nearly independent of the position on the wafer. This indicates that a gas volume at the edge of the wafer would have substantially similar gas concentrations of etchgas and etchproduct to a gas volume at the center. Thus, the GDP 60 of the invention uniformly produces small cells of local equilibrium in gas pressure across the wafer. As such, even when using wafers having a diameter of 300 mm and up, the rate of etching is substantially uniform across the wafer, i.e. the rate of etching at the edge of the wafer is substantially equal to the rate of etching near the center.

Figure 4B:
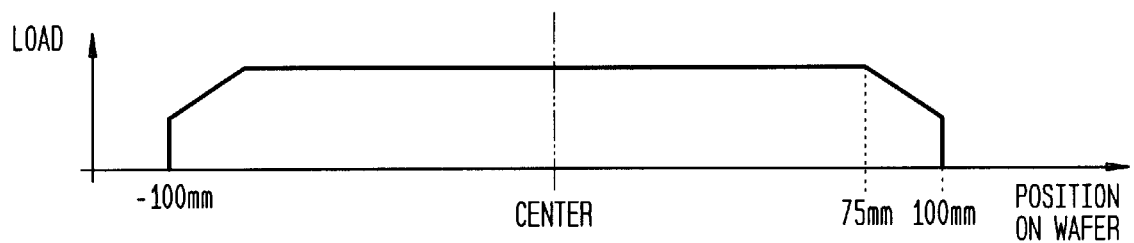
FIG. 4B shows a plot of etching gas load versus radial distance from the center of the wafer.

Referring to FIGS. 4A and 4B, a chip distribution on a 200 mm wafer during processing is shown. Wafer 100 is disposed centrally within the process chamber. Wafer 100 has its center below the center of GDP 60 during processing. Due to the rectangular shape of the chips 110, chip arrangement on wafer 100 creates a vacant area on the periphery 104 of wafer 100. Therefore, the amount of etchgas 88 required, referred to as load, at the center of wafer 100 is higher than at periphery 104 of wafer 100.

FIG. 4B shows a plot of load versus distance for a 256 Mb DRAM chips 110 on a 200 mm wafer 100 for a typical wafer etching process. The load decreases from the center value in the transitional area between 75 mm to 100 mm radius and becomes 0 beyond 100 mm. The problem is amplified for larger wafers.

Figure 5:
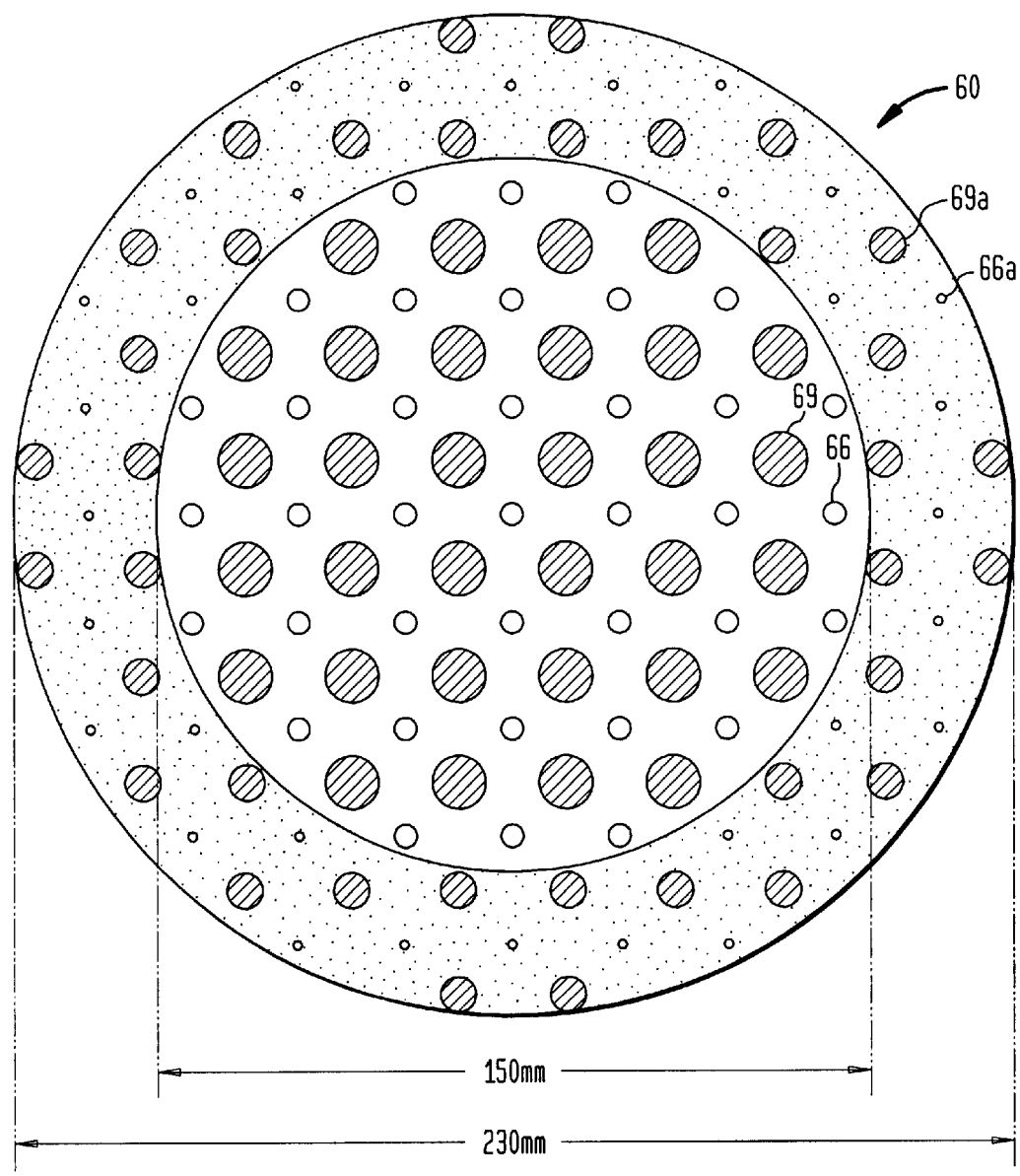
FIG. 5 depicts a bottom plan view of the gas distribution plate having reduced area apertures corresponding to areas of reduced load on the wafer.

In accordance with the illustrative technique of the present invention, a more uniform rate of etching is achieved. Referring to FIG. 5, the load at the periphery of a wafer is less due to the absence of chips. Gas outlet apertures 66a and gas through channels 69a are reduced in size to correlate with reduced load at the periphery of a wafer. Preferably, a 300 mm wafer has GDP 60 with gas outlet apertures 66a and gas through channels 69a beyond a radius of 75 mm. The areas of gas outlet apertures 66 and gas through channels 69 are about half of the apertures and channels within a 75 mm radius. Advantageously, the reduced areas accommodate the reduced load in the transition area and at the periphery of a 300 mm wafer. It is further contemplated that apertures 66 and channels 69 can have predetermined areas at predetermined locations on GDP 60 to adjust the flow at to accommodate different load conditions on the wafer. By creating a condition in which load conditions are accounted for in conjunction with uniform gas concentrations, an improved etching process is realized.

It should be understood that the embodiments described herein are merely exemplary and that a person skilled in the art may make variations and modifications to these embodiments utilizing functionally equivalent elements to those described herein. Any and all such modifications as well as others which may be apparent to those skilled in the art are intended to be included within the scope of the present invention as defined by the appended claims.

What is claimed is:

1. A gas distribution plate for use in a semiconductor processing chamber to distribute gases across a surface of a semiconductor wafer to be processed in the chamber, the gas distribution plate comprising:

means for receiving a reactant gas flow substantially without introducing turbulence;

means for directing the reactant gas flow in direction substantially parallel to a major plane of the gas distribution plate;

means for introducing the reactant gas flow to the chamber in a direction substantially perpendicular to the major plane of the gas distribution plate; and means for expelling a product gas flow from a volume of the chamber substantially adjacent to said means for introducing for maintaining a predetermined concentration of the reactant gas and a predetermined concentration of the product gas across the portion of the surface of the semiconductor wafer substantially adjacent to said means for introducing.

2. A gas distribution plate as defined in claim 1, further comprising means for limiting the flow rates of the reactant and product gases across a portion of the surface of the semiconductor wafer that has a reduced chip density while maintaining a predetermined concentration of the reactant gas and a predetermined concentration of the product gas across substantially the entire surface of the semiconductor wafer during wafer processing.

\* \* \* \* \*